United States Patent
Zamprogno et al.

(10) Patent No.: US 9,024,798 B2
(45) Date of Patent: May 5, 2015

(54) METHOD OF SUCCESSIVE APPROXIMATION A/D CONVERSION

(71) Applicant: ST-Ericsson SA, Plan-les-Ouates (CH)

(72) Inventors: Marco Zamprogno, Cesano Maderno (IT); Francesca Girardi, Cesano Maderno (IT); Alberto Minuti, Caorso (IT)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 14/360,860

(22) PCT Filed: Nov. 8, 2012

(86) PCT No.: PCT/EP2012/072167
§ 371 (c)(1),
(2) Date: May 27, 2014

(87) PCT Pub. No.: WO2013/079295
PCT Pub. Date: Jun. 6, 2013

(65) Prior Publication Data
US 2015/0084801 A1 Mar. 26, 2015

Related U.S. Application Data

(60) Provisional application No. 61/590,116, filed on Jan. 24, 2012.

(30) Foreign Application Priority Data

Dec. 2, 2011 (EP) .................... 11191807

(51) Int. Cl.
*H03M 1/34* (2006.01)
*H03M 1/46* (2006.01)
*H03M 1/42* (2006.01)
*H03M 1/08* (2006.01)

(52) U.S. Cl.
CPC ............ *H03M 1/466* (2013.01); *H03M 1/42* (2013.01); *H03M 1/0845* (2013.01)

(58) Field of Classification Search
CPC ........ H03M 1/0697; H03M 1/42; H03M 1/06

USPC .................... 341/163, 155, 144, 118, 172
See application file for complete search history.

(56) References Cited

U.S. PATENT DOCUMENTS 4,620,179 A 10/1986 Cooper et al.
7,190,300 B2 3/2007 Confalonieri et al.
(Continued)

FOREIGN PATENT DOCUMENTS

DE 10258783 A1 7/2004
EP 0729236 A1 8/1996

OTHER PUBLICATIONS

Giannini, V. et al. "An 820μW 9b 40MS/s Noise-Tolerant Dynamic-SAR ADC in 90nm Digital CMOS." 2008 IEEE International Solid-State Circuits Conference, ISSCC 2008, Digest of Technical Papers, Feb. 2008, pp. 238-239, 610.

*Primary Examiner* — Peguy JeanPierre
(74) *Attorney, Agent, or Firm* — Coats & Bennett, PLLC

(57) ABSTRACT

According to a method of Successive Approximation Register (SAR) analog to digital conversion, N+1 SAR cycles are performed to obtain an output digital code having N bits. An analog signal is sampled and obtained. After execution of the first N−1 SAR cycles, the $N^{th}$ SAR cycle is performed by setting a $N^{th}$ tentative analog signal corresponding to a provisional digital code and comparing the $N^{th}$ tentative analog signal with the sampled analog signal to obtain a $N^{th}$ comparison result. The $(N+1)^{th}$ SAR cycle is performed by setting a $(N+1)^{th}$ tentative analog signal based on the $N^{th}$ comparison result, comparing the $(N+1)^{th}$ tentative analog signal with the sampled analog signal to obtain a second comparison result, and correcting the provisional digital code based on the $(N+1)^{th}$ comparison result to obtain the output digital code. The $N^{th}$ and $(N+1)^{th}$ SAR cycles each comprise a plurality sub-comparisons and yield a set of sub-results.

12 Claims, 3 Drawing Sheets

(56) References Cited

U.S. PATENT DOCUMENTS

| | | | |
|---|---|---|---|
| 8,922,405 B2 * | 12/2014 | Lin et al. | 341/120 |
| 2003/0123646 A1 | 7/2003 | Srinivasan et al. | |
| 2013/0033392 A1 * | 2/2013 | Nani et al. | 341/166 |
| 2014/0183333 A1 * | 7/2014 | Johansson | 250/208.1 |
| 2014/0285370 A1 * | 9/2014 | Miki et al. | 341/172 |

* cited by examiner

METHOD OF SUCCESSIVE APPROXIMATION A/D CONVERSION

TECHNICAL FIELD

The present disclosure relates to the technical field of the conversion of analog signals into digital signals and more in particular to a method of successive approximation analog to digital conversion and an analog to digital converter.

BACKGROUND ART

In many applications there is the need to measure one or, usually, more low frequency analog signals. This is for example the case of mobile communication terminals, where there is often the need to measure several operating parameters, such as the charge level of the battery, the temperature of the battery, the status of the connection to an external device, etc. Usually the analog signals that have to be measured are low frequency signals (for example from 0 to 500 Hz). A general purpose ADC (in short GPADC) is often used to convert the above mentioned signals from the analog to the digital domain while measuring them. In particular, SAR (Successive Approximation Register) analog to digital converters are widely diffused in the above applications due to the fact that such converters are particularly suitable for converting multiple signals at a conversion rate which is relatively low, for example of about 100 ksamples/second. An example of a switched capacitances SAR analog to digital converter is disclosed in U.S. Pat. No. 7,190,300.

SAR analog to digital converters are based on a conversion algorithm that, bit by bit, determines the output digital code, starting from the most significant bit (MSB) up to the least significant bit (LSB). After an initial phase called sampling phase, during which sample of the input signal is stored into the converter, each bit is determined during a cycle, also called SAR cycle, comprising a tentative voltage setting phase and a subsequent comparison phase. The latter is generally performed through an analog comparator. It is well known to a man skilled in the field that the comparison of the last SAR cycle, i.e. the cycle in which the LSB is determined, is particularly critical because the converter is stressed to the outmost, mainly but not exclusively from the point of view of the settling time. In such comparison, the comparator has to compare two voltages having a difference smaller than an LSB. Even the noise produced in the converter by different sources is a factor that affects in particular the comparison performed in the last SAR cycle.

As is well known to a man skilled in the field of SAR analog to digital converters, the above mentioned last comparison is not the only critical one, because there is always an additional critical comparison occurring on one of the previous N−1 comparisons. It is not possible to foresee in which SAR cycle such additional critical comparison takes place.

In order to achieve an effective resolution of N bits for the SAR analog to digital converter it is very important to perform correctly the two above mentioned critical comparisons. Such critical comparisons may be negatively affected by settling time of analog blocks of the ADC and by noise coming from different sources such as: the reference voltage buffer, the comparator, the capacitive array (KT/C noise).

The paper "An 820uW 9b 40MS/s Noise-Tolerant Dynamic-SAR ADC in 90 nm Digital CMOS", V. Giannini et Al., ISSCC Dig. Tech. Papers, pp. 238-240, February 2008, addresses the problem of the influence on the resolution of the ADC of the two above mentioned critical comparisons.

The paper in particular discloses an algorithm in which another SAR cycle (the $(N+1)^{th}$) is added at the end of the classical SAR algorithm. The additional SAR cycle is added with the aim of correcting a possible error occurred in the previous N comparisons. The additional SAR cycle is redundant: it's aim is not to increase the number of bits of ADC resolution. According to the disclosure of the paper, the algorithm controller takes into account the result of the $N^{th}$ comparison, and, relying on such result, understands whether the digital result of the classical SAR algorithm, obtained after the $N^{th}$ cycle, is a round up or a round down of the ideal value of the input voltage. If it turns out to be a round up value, the controller generates a tentative for the $(N+1)^{th}$ comparison that is the round down or vice versa. The advantage of this comparison addition is that the critical comparisons, can be corrected (if such comparison was wrong by an error lower than 1 LSB) through the $(N+1)^{th}$ SAR cycle. In order to obtain this, the approach disclosed in the paper is the following:

the SAR cycle, and consequently the comparisons, from the $1^{st}$ to the $(N-1)^{th}$ are performed using a low-consumption noisy comparator; and the $N^{th}$ and $(N+1)^{th}$ SAR cycle, and consequently the corresponding comparisons, are performed using a different high-consumption low-noise comparator.

The prior art solution disclosed in the above paper has a drawback due to the fact that the effectiveness of the error correction algorithm is mainly restrained to the comparators' noise which, in many cases, is not the dominant noise contribute in a SAR ADC. For example, the noise of voltage buffer(s), provided for supplying internal reference voltage(s) needed to perform SAR cycles, is not taken into account. This contribute, along with KT/C noise, is not reduced at all by the approach disclosed in the above indicated paper.

Furthermore, the fact that there two different comparators are required has a design cost that is not negligible. In fact, the matching (for instance between two different offset performances) of the configurations of the two comparators becomes a critical aspect from converter linearity point of view. Moreover, the provision of two comparators increases the cost in terms of area and power consumption.

SUMMARY OF THE INVENTION

It is an object of the present invention to provide a successive approximation analog to digital conversion method which is adapted to solve the problems of the prior art SAR analog to digital conversion methods.

The above object is reached by method of SAR analog to digital conversion being adapted to perform N+1 SAR cycles for obtaining an output digital code $X^C$ having N bits. The method comprises a step of receiving and sampling an analog signal. The method comprises a step of performing N−1 SAR cycles. Each of said N−1 SAR cycles comprises setting a tentative analog signal corresponding to an approximate value of the output digital code and comparing the sampled analog signal with the tentative analog signal. The method comprises also performing the $N^{th}$ SAR cycle by setting a $N^{th}$ tentative analog signal corresponding to a provisional digital code and comparing the $N^{th}$ tentative analog signal with the sampled analog signal thus obtaining a $N^{th}$ comparison result. The step of comparing the $N^{th}$ tentative analog signal with the sampled analog signal comprises performing a plurality of M sub-comparisons, between the $N^{th}$ tentative analog signal and the sampled analog signal, thus obtaining M sub-results. The $N^{th}$ comparison result is obtained according to a first decision criterion that takes into account said M sub-results.

The method comprises also performing the (N+1)$^{th}$ SAR cycle by setting a (N+1)$^{th}$ tentative analog signal on the basis of the N$^{th}$ comparison result, comparing the (N+1)$^{th}$ tentative analog signal with the sampled analog signal thus obtaining a second comparison result and correcting the provisional digital code on the basis of the (N+1)$^{th}$ comparison result for obtaining the output digital code. Said comparing the (N+1)$^{th}$ tentative analog signal with the sampled analog signal comprises performing a plurality of K sub-comparisons, between the (N+1)$^{th}$ tentative analog signal and the sampled analog signal, thus obtaining K sub-results. The (N+1)$^{th}$ comparison result is obtained according to a second decision criterion that takes into account said K sub-results.

According to an embodiment M and/or K are odd integers and the first and/or second decision criteria are majority decision criteria.

The above object is also reached by a SAR analog to digital converter comprising:
- a sampling section adapted to sample an analog signal Vin to be converted into a digital code of N bits;
- a comparator connected to the sampling section and adapted to compare the sampled analog signal with a tentative analog signal and to provide output signals as a function of the difference between the sampled analog signal and the tentative analog signal;
- a SAR logic unit coupled at the output of the comparator.

The converter 24 is adapted to perform N−1 SAR cycles. In each of said N−1 cycles the SAR logic unit is adapted to set a tentative analog signal corresponding to an approximate value of the output digital code and said comparator is adapted to compare the sampled analog signal with the tentative analog signal. The converter is adapted to perform the N$^{th}$ SAR cycle. In said cycle the SAR logic unit is adapted to set a N$^{th}$ tentative analog signal corresponding to a provisional digital code and said comparator is adapted to compare the N$^{th}$ tentative analog signal with the sampled analog signal in order to obtain a N$^{th}$ comparison result. The converter is adapted to perform the (N+1)$^{th}$ SAR cycle in which: said SAR logic unit is adapted to set a (N+1)$^{th}$ tentative analog signal on the basis of the first comparison result, the comparator is adapted to compare said (N+1)$^{th}$ tentative analog signal with the sampled analog signal in order to obtain a (N+1)$^{th}$ comparison result, the SAR logic unit is adapted to correct the provisional digital code on the basis of the second comparison result. The converter is adapted to compare through said comparator the N$^{th}$ tentative analog signal with the sampled analog signal by performing a plurality of M sub-comparisons, between the N$^{th}$ tentative analog signal and the sampled analog signal, in order to obtain M sub-results. The N$^{th}$ comparison result being obtained according to a first decision criterion that takes into account said M sub-results. The converter is adapted to compare through said comparator the (N+1)$^{th}$ tentative analog signal with the sampled analog signal by performing a plurality of K sub-comparisons, between the (N+1)$^{th}$ tentative analog signal and the sampled analog signal, thus obtaining K sub-results. The (N+1)$^{th}$ comparison result is obtained according to a second decision criterion that takes into account said K sub-results.

BRIEF DESCRIPTION OF THE DRAWINGS

Further features and advantages of the present invention will become more apparent from the following detailed description of exemplary but non-limiting embodiments thereof, as illustrated in the attached figures, in which.

DETAILED DESCRIPTION

In the attached figures identical or similar elements will be indicated with the same reference numbers/symbols.

Figure 1:
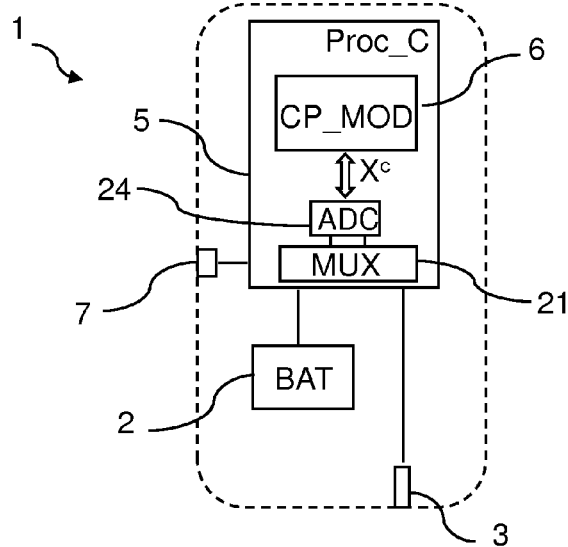
FIG. 1 shows a very schematic view of a mobile communication device.

FIG. 1 illustrates a very schematic view of an embodiment of mobile terminal 1, such as for example a mobile phone, comprising a modem/application processor chip 5 (Proc_C). Said chip 5 comprises an analog to digital converter 24 (ADC) which for example, and without for this reason introducing any limitation, is a general purpose analog to digital converter (GPADC). The analog to digital converter 24 is adapted to receive at least one input analog signal to be converted. The analog to digital converter 24 is a SAR (Successive Approximation Register) analog to digital converter.

According to an embodiment, the at least one input analog signal comprises a plurality of analog signals that are selectively provided to the above mentioned SAR analog to digital converter 24 through a multiplexer 21 (MUX) comprised in the chip 5.

According to an embodiment, the modem/application processor chip 5 comprises a control and processing module 6 (CP_MOD) coupled at the output of the SAR analog to digital converter 24. The control and processing module 6 is adapted to receive from the latter digital samples X (or digital codes) of the analog input signals and to process said samples X for controlling the operation of the mobile terminal 1. According to an exemplary embodiment, the control and processing module 6 on the basis of the above mentioned digital codes X is adapted to detect the status of an USB interface 7 of the mobile terminal 1, to monitor the status of charge and the temperature of a battery 2 (BAT) of the mobile terminal 1, to monitor the status of an external accessory of the mobile terminal 1, such for example an earphone or a battery charger removably connectable to a dedicated connection port 3 of the mobile terminal 1. It is therefore clear that in the particular example described a plurality of input analog signals are selectively fed to the SAR analog to digital converter 24. In general, in typical applications related to mobile terminals there is the need of coupling up to ten or fifteen input signals to the SAR analog to digital converter 24.

Since the general structure and the operation of a mobile terminal, such for example a mobile phone, are well known to a man skilled in the field, for sake of conciseness they will not be detailed further in the following part of the description. On the contrary, the following part of the description will be mainly focused on the SAR analog to digital converter 24 of FIG. 2 and the SAR analog to digital conversion method 100 of FIG. 3. It is important to remark that the above mentioned SAR analog to digital converter 24 and SAR analog to digital conversion method 100 can be also employed in systems and and/or devices different from a mobile terminal 1, for example in general in devices such as: consumer electronic devices, automotive devices, medical devices, etc.

Figure 2:
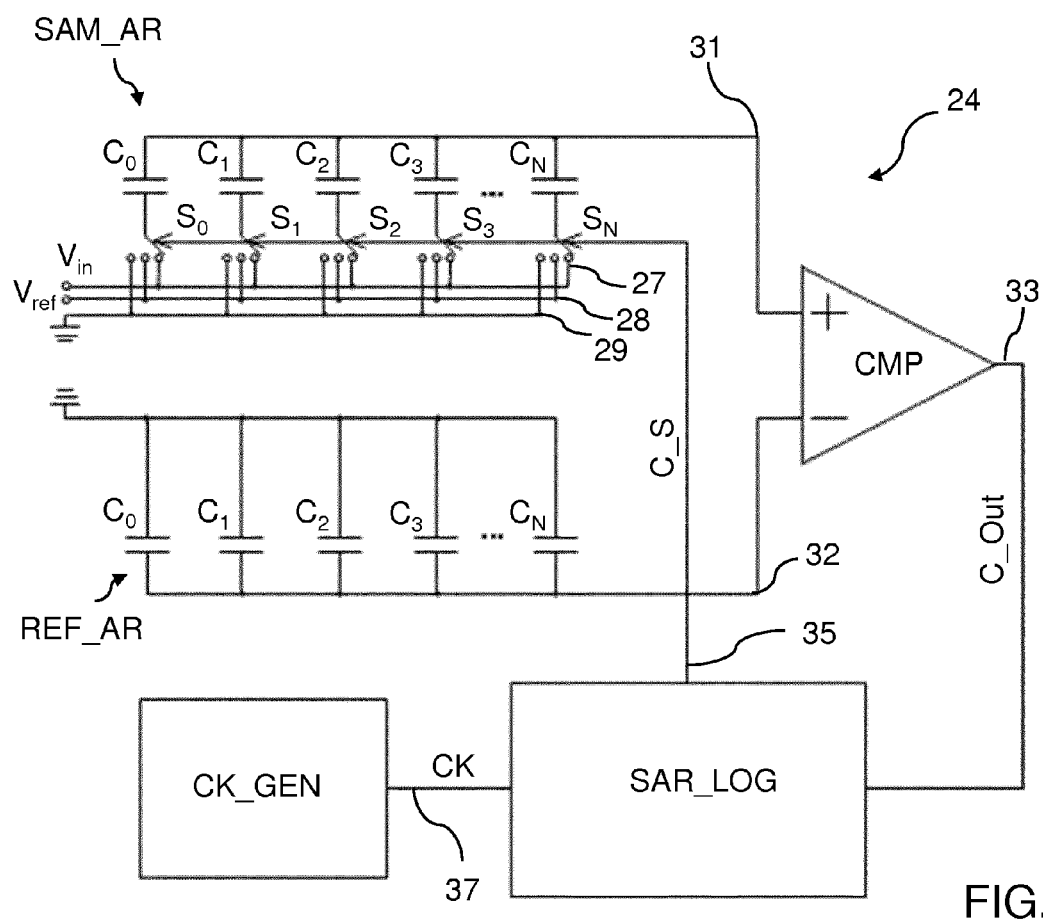
FIG. 2 shows a successive approximation analog to digital converter that may be included in the mobile communication device of FIG. 1.

An embodiment of SAR analog to digital converter is schematically shown in the block diagram of FIG. 2. According to the above embodiment, the SAR analog to digital converter 24 is a switched capacitances pseudo-differential SAR analog to digital converter. For this reason, the SAR analog to digital converter 24 according to the above embodiment comprises a sampling section SAM_AR comprising a sampling array SAM_AR comprising sampling elements in the form of an array of capacitors $C_0$-$C_N$ and associated controllable switches $S_0$-$S_N$. Said capacitors $C_0$-$C_N$ have a first side connected to a common node 31. The controllable switches $S_0$-$S_N$ are provided for selectively connecting a second side of each of said capacitors $C_0$-$C_N$ to an input signal $V_{in}$ terminal 27, to a reference signal $V_{ref}$ terminal 28, and to a ground terminal 29. As is well known to a man skilled in the field, the capacitors $C_0$-$C_N$ have capacitance values having weighting values which are powers of two of a unitary capacitance value C. For example $C_0$=$C_1$=C, $C_2$=2C, C3=4C, $C_N$=C×$2^{N-1}$. Moreover, as it is well known to a man skilled in the field that, since the SAR converter 24 of FIG. 2 has a pseudo-differential architecture, the converter 24 comprises a further array of capacitors REF_AR, comprising capacitors identical to the capacitors of the sampling array SAM_AR. Said capacitors have a first side connected to a second common node 32 and a second side connected to ground.

It must be clear that according to different embodiments, the SAR analog to digital converter 24 can be a SAR analog to digital converter of a different typology, for example a fully differential SAR converter, a single-ended SAR converter, a SAR converter without switched capacitances but with elements of different kind, for example resistive elements.

The SAR analog to digital converter 24 is adapted to convert an input analog signal $V_{in}$, which is for example an analog voltage, into a digital code X having N bits. The digital code X begins with a most significant bit (MSB) and ends with a least significant bit (LSB).

The SAR analog to digital converter 24 comprises a comparator CMP connected to the sampling section SAM_AR. In the particular example shown, the comparator CMP is an analog comparator and has a first input connected to the first common node 31 and a second input connected to the second common node 32. The comparator CMP is adapted to compare the input analog signal $V_{in}$ sampled by the sampling section SAM_AR with a tentative analog signal corresponding to a tentative digital code and to provide an output signal C_out as a function of the difference between the sampled analog input signal and the tentative analog signal.

The SAR analog to digital converter 24 comprises a SAR logic unit SAR_LOG coupled at the output of the comparator CMP and adapted to receive the output signals C_Out provided by the comparator CMP. As is well known to a man skilled in the field, the SAR logic unit SAR_LOG is adapted to set at each SAR cycle, in the example through its output signal C_S, the switches $S_0$-$S_N$, the capacitors of the sampling array SAM, AR and the reference signal $V_{ref}$, a tentative analog signal which has to be compared by the comparator CMP with the sampled input analog signal $V_{in}$.

The SAR analog to digital converter 24 comprises a clock generation unit CK_GEN adapted to provide to the SAR logic unit SAR_LOG a clock signal CK.

The SAR analog to digital converter 24 is adapted to convert through N+1 SAR cycles the input analog signal $V_{in}$ into an output digital code $X^C$ having N bits. The SAR logic unit SAR_LOG is adapted to set, at each SAR cycle, a tentative analog signal corresponding to an approximate value the output digital code $X^C$, or in other words corresponding to a tentative digital code. The comparator CMP is adapted to compare, at each SAR cycle, the sampled signal with said tentative analog signal providing a corresponding output signal C_Out.

The SAR analog to digital converter 24, is adapted to perform the first N−1 SAR cycles according to the classical SAR search algorithm, which is well known to a man skilled in the field. After said N−1 SAR cycles a digital code $X^S$ is obtained whose first N−1 bits have been determined according to the classical search algorithm.

The SAR analog to digital converter 24, is adapted to perform the $N^{th}$ SAR cycle by setting a $N^{th}$ tentative analog signal corresponding to a provisional digital code $X^P$. For example, the provisional code $X^P$ is obtained from the digital code $X^S$ by setting to 1 the least significant bit of the code $X^S$. Moreover, the SAR analog to digital converter 24 is adapted to compare the $N^{th}$ tentative analog signal with the sampled analog signal thus obtaining a $N^{th}$ comparison result.

More in particular, the SAR converter 24 is adapted to compare through the comparator CMP the $N^{th}$ tentative analog signal with the sampled analog signal by performing a plurality of M sub-comparisons, between the $N^{th}$ tentative analog signal and the sampled analog signal, in order to obtain M sub-results. The $N^{th}$ comparison result is obtained according to a first decision criterion that takes into account said M sub-results. M is an integer greater than one.

Said M sub-results are stored, for example in a memory provided in the SAR logic unit SAR_LOG.

According to an embodiment M is an odd integer and the first decision criterion is a majority criterion.

M can be also an even integer greater than one. In this case it could be convenient that the first decision criterion takes into account a weighting of the M sub-results. For example, if M=4 it will be possible to give to the last two sub-results a greater weight than the first two sub-results.

The SAR analog to digital converter 24 is also adapted to perform the $(N+1)^{th}$ SAR cycle. In said $(N+1)^{th}$ SAR cycle:
the SAR logic unit SAR_LOG is adapted to set a $(N+1)^{th}$ tentative analog signal on the basis of the $N^{th}$ comparison result;
the comparator CMP is adapted to compare said $(N+1)^{th}$ tentative analog signal with the sampled analog signal in order to obtain a $(N+1)^{th}$ comparison result;
the SAR logic unit SAR_LOG is adapted to correct the provisional digital code $X^P$ on the basis of the $(N+1)^{th}$ comparison result.

More in particular, the SAR converter 24 is adapted to compare through said comparator CMP the $(N+1)^{th}$ tentative analog signal with the sampled analog signal by performing a plurality of K sub-comparisons, between the $(N+1)^{th}$ tentative analog signal and the sampled analog signal, thus obtaining K sub-results. The $(N+1)^{th}$ comparison result is obtained according to a second decision criterion that takes into account the K sub-results. K is an integer greater than one.

According to an embodiment K is an odd integer and the second decision criterion is a majority criterion.

K can be also an even integer greater than one. In this case it could be convenient that the second comparison decision criterion takes into account a weighting of the K sub results. For example, if K=4 it will be possible to give to the last two sub-results a greater weight than the first two sub-results.

According to an embodiment K=M, for example K=M=3. The following table shows an embodiment of a possible way of executing the $N^{th}$ SAR cycle and the subsequent correction, in the particular and not limitative embodiment in which N=10 (i.e. the resolution of the SAR converter 24 is 10 bits), M=K=3 and the first and second decision criteria are majority decision criteria.

| 10$^{th}$ Tentative | 10$^{th}$(1) | 10$^{th}$(2) | 10$^{th}$(3) | 10$^{th}$ Result | 11$^{th}$ Tentative | 11$^{th}$(1) | 11$^{th}$(2) | 11$^{th}$(3) | 11$^{th}$ Result | ADC Result = X$^c$ |
|---|---|---|---|---|---|---|---|---|---|---|
| X$^P$ | 0 | 0 | 0 | 0 | X$^P$ – 1 | 0 | 0 | 0 | 0 | X$^P$ – 2 |
|  |  |  |  |  |  | 0 | 0 | 1 |  |  |
|  | 0 | 0 | 1 |  |  | 0 | 1 | 0 |  |  |
|  |  |  |  |  |  | 1 | 0 | 0 |  |  |
|  | 0 | 1 | 0 |  |  | 0 | 1 | 1 | 1 | X$^P$ – 1 |
|  |  |  |  |  |  | 1 | 0 | 1 |  |  |
|  | 1 | 0 | 0 |  |  | 1 | 1 | 0 |  |  |
|  |  |  |  |  |  | 1 | 1 | 1 |  |  |
|  | 0 | 1 | 1 | 1 | X$^P$ + 1 | 0 | 0 | 0 | 0 | X |
|  |  |  |  |  |  | 0 | 0 | 1 |  |  |
|  | 1 | 0 | 1 |  |  | 0 | 1 | 0 |  |  |
|  |  |  |  |  |  | 1 | 0 | 0 |  |  |
|  | 1 | 1 | 0 |  |  | 0 | 1 | 1 | 1 | X$^P$ + 1 |
|  |  |  |  |  |  | 1 | 0 | 1 |  |  |
|  | 1 | 1 | 1 |  |  | 1 | 1 | 0 |  |  |
|  |  |  |  |  |  | 1 | 1 | 1 |  |  |

Starting from the left column, X$^P$ represents the tentative digital code that corresponds to the tentative analog signal which is compared at the N$^{th}$ SAR cycle (i.e. the 10$^{th}$ SAR cycle) with the sampled input analog signal V$_{in}$. Since M=3, the above comparison by the comparator CMP is performed three times. In the above table, the values under the columns named "10$^{th}$(1)", "10$^{th}$(2)" "10$^{th}$(3)" represent the M=3 sub-results of the above three comparisons. The sub-result is "1" when the tentative analog signal (in this case the voltage of said signal) exceeds the sampled input analog signal (in this case its sampled voltage), otherwise it is "0". The table takes into account all the possible combinations of said M=3 three sub-results. The column named "10$^{th}$ Result" represents the output of the first decision criterion for each possible combination of the M=3 sub-results, in other words it represents the 10$^{th}$ comparison result. In the example:

for the first four rows of the M sub-results the first comparison decision criterion is such to establish that the 10$^{th}$ comparison result is "0";

for the last four rows of the M sub-results the first comparison decision criterion is such to establish that the 10$^{th}$ comparison result is "1".

The remaining columns of the table indicate a possible way in which the correction of the provisional digital code X$^P$ can be performed (at the end of 11$^{th}$=(N+1)$^{th}$ SAR cycle) by the SAR analog to digital converter 24.

Before starting the 11$^{th}$ SAR cycle the 11$^{th}$ tentative analog signal is set. Such 11$^{th}$ tentative analog signal corresponds, to a new digital code (column named "11$^{th}$ Tentative") determined by subtracting/adding, in function of the 11$^{th}$ comparison result, one bit from/to the digital code X$^P$ corresponding to the 10$^{th}$ tentative analog signal set at the beginning of the 10$^{th}$ SAR cycle. The above indicated 11$^{th}$ tentative analog signal is compared at the 11$^{th}$ SAR cycle (i.e. in the example in the 11$^{th}$ SAR cycle) with the sampled input analog signal V$_{in}$. Since K=3, the above comparison is performed three times by the comparator CMP. In the above table the values under the columns named "11$^{th}$(1)", "11$^{th}$(2)", "11$^{th}$(3)" represent the K=3 sub-results of the above three comparisons. The table takes into account all the possible combinations of said K=3 sub-results. The column named "11$^{th}$ Result" represents the output of the second decision criterion for each possible combination of the K=3 sub-results. In other words it represents the result of the 11$^{th}$ comparison. The column named "ADC results" represents the correction to be performed on the provisional digital code X$^P$. Said correction depends on the result of the (N+1)$^{th}$ comparison. According to an embodiment, as is clear from the above table, said correction depends also on the 10$^{th}$=N$^{th}$ comparison result.

Figure 3:
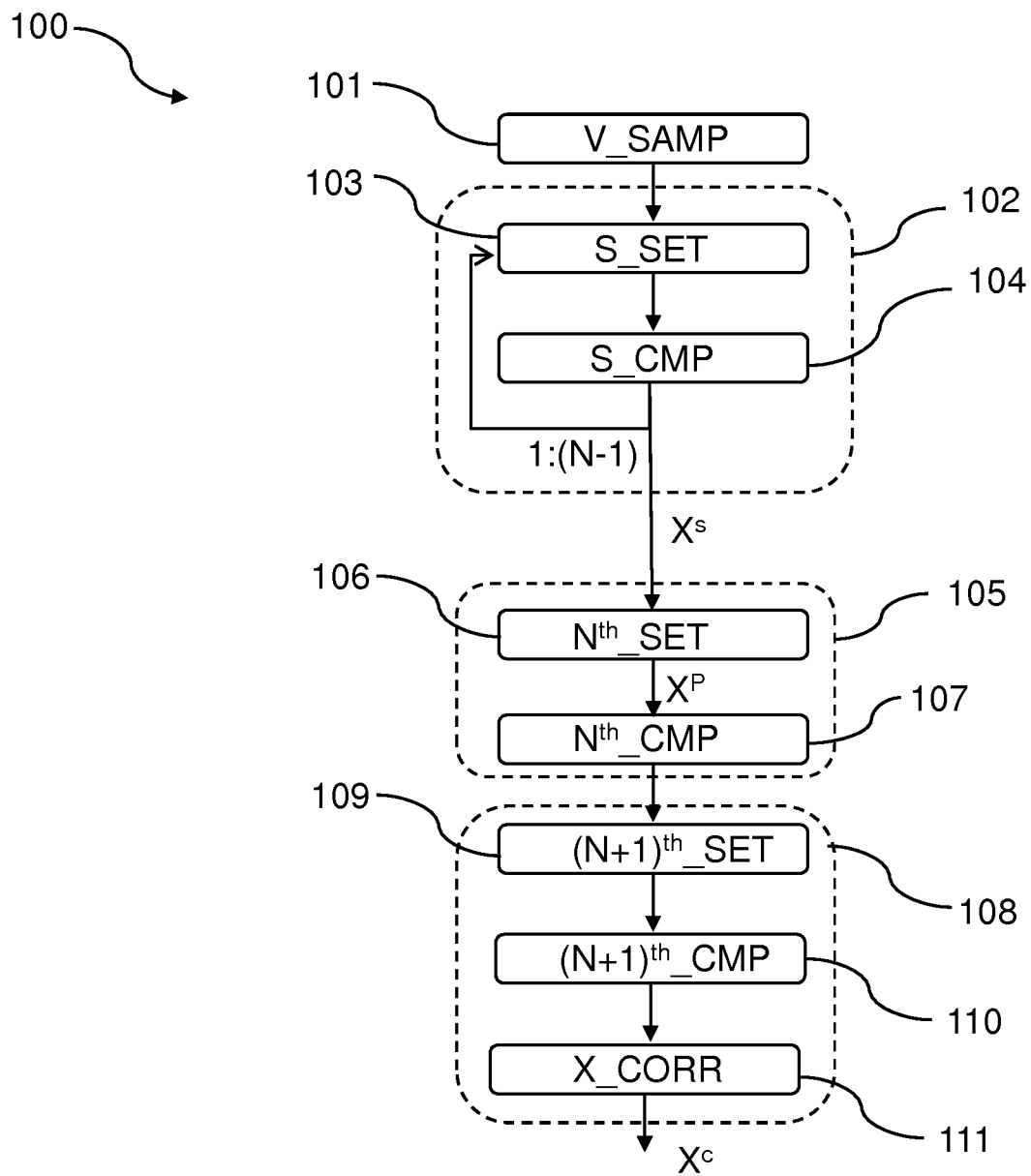
FIG. 3 shows the flow chart of a successive approximation analog to digital conversion method that can be implemented in the converter of FIG. 2.

With reference to FIG. 3, the above description made for the SAR analog to digital converter 24 of FIG. 2, corresponds to the description of a SAR analog to digital conversion method whose simplified flow chart is schematically represented in FIG. 3.

The method 100 comprises performing N+1 SAR cycles for obtaining an output digital code X$^C$ having N bits.

The method 100 comprises a step 101 (V_SAMP) of receiving and sampling an analog signal V$_{in}$.

The method 100 comprises the step 102 of performing N−1 SAR cycles. Each of said N−1 SAR cycles comprises setting 103 (S_SET) a tentative analog signal corresponding to an approximate value X$^S$ of the output digital code X$^C$ and comparing 104 (S_CMP) the sampled analog signal with the tentative analog signal.

The method 100 comprises the step of performing 105 the N$^{th}$ SAR cycle by setting 106 (N$^{th}$_SET) a N$^{th}$ tentative analog signal corresponding to a provisional digital code X$^P$ and comparing 107 (N$^{th}$_CMP) the N$^{th}$ tentative analog signal with the sampled analog signal thus obtaining the N$^{th}$ comparison result. Said comparing 107 the N$^{th}$ tentative analog signal with the sampled analog signal comprises performing a plurality of M sub-comparisons, between the N$^{th}$ tentative analog signal and the sampled analog signal, thus obtaining M sub-results. The N$^{th}$ comparison result is obtained according to a first decision criterion that takes into account said M sub-results. M is an integer greater than one.

The method 100 comprises the step of performing 108 the (N+1)$^{th}$ SAR cycle by setting 109 ((N+1)$^{th}$_SET) a (N+1)$^{th}$ tentative analog signal on the basis of the first comparison result, comparing 110 ((N+1)$^{th}$_CMP) the (N+1)$^{th}$ tentative analog signal with the sampled analog signal thus obtaining the (N+1)$^{th}$ comparison result and correcting 111 (X_CORR) the provisional digital code X$^P$ on the basis of the second comparison result for obtaining said output digital code X$^C$. Said comparing 110 the (N+1)$^{th}$ tentative analog signal with the sampled analog signal comprises performing a plurality of K sub-comparisons, between the (N+1)$^{th}$ tentative analog signal and the sampled analog signal, thus obtaining K sub-results, the (N+1)$^{th}$ comparison result being obtained according to a second decision criterion that takes into account said K sub-results. K is an integer greater than one.

According to an embodiment, wherein the setting 108 of the (N+1)$^{th}$ tentative analog signal on the basis of the first comparison result, comprises obtaining the (N+1)$^{th}$ tentative analog signal as an analog signal corresponding to a digital code obtained by subtracting/adding one bit from/to the provisional digital code $X^P$.

According to an embodiment in the correction step 11 said output digital code $X^C$ is obtained modifying the provisional digital code $X^P$ by an addition or subtraction based on said second result. According to an embodiment, said correction based on the $(N+1)^{th}$ comparison result is such to obtain the output digital code $X^C$ as:

$X^C = X^P - 2$ (subtraction); or
$X^C = X^P - 1$ (subtraction); or
$X^C = X^P$ (i.e. confirm the provisional digital code);
$X^C = X^P - 1$ (increase).

In general, concerning the values of the integers K and M and the first and the second decision criteria, the same considerations already made with reference to the description of the SAR analog to digital converter 24 apply mutatis mutandis for the method 100, comprising the example described with reference with the above reported table in which M=K=3 and N=10 bit.

Figure 4:
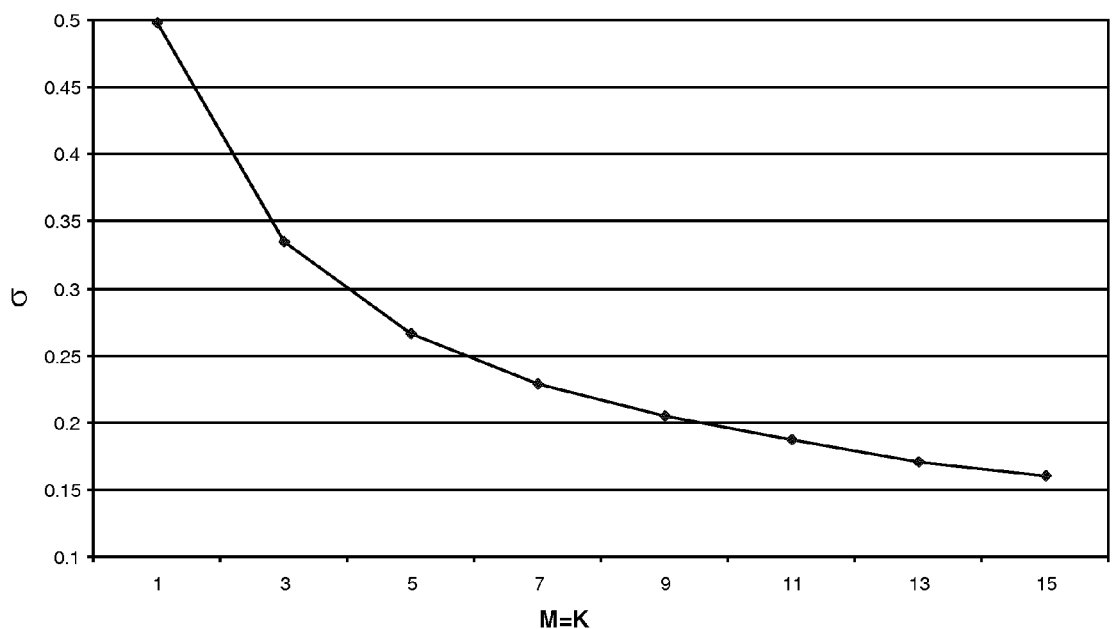
FIG. 4 is a chart showing experimental results obtained with the conversion method of FIG. 3.

The above converter and method have shown to significantly reduce the effects of the noise produced by the different noise sources mentioned in the section background art of the present description. The bigger are the values of M and K and the lower is the noise, as it is possible to observe in FIG. 4 in which σ represents the standard deviation of a gaussian distributed model noise normalized to the half LSB.

The only drawback of the above approach seems to be the increased time needed for the comparisons of the last two SAR cycles. Actually, this aspect is not so relevant, for many reasons. The first is that, for example in a mobile phone, among the input voltages that a GPADC has to convert, many of them offers high input impedance, hence their sampling has a slow settling due to the RC time constant. Accordingly, there are applications in which the sampling time is often the dominant contribution to total conversion time, which would only be slightly affected by the extra time needed for the comparisons of the last two SAR cycles. Moreover, in the specific case of the mobile phone, GPADC conversions are required at a very low frequency (due to the kind of signal they have to convert). So, taking into account that the converter is turned off after every conversion, a weak increase of conversion time is not critical from functionality and consumption point of view.

Moreover, during sub-comparisons of the same set, the tentative analog signal does not vary and varies only by one LSB between the $N^{th}$ and the $(N+1)^{th}$ SAR cycle. This results in a very fast settling of the input comparator voltage during comparisons of a same set. Since that, those comparisons can be sped up by raising the clock frequency, given that the half period is enough for the comparator to reset properly.

Moreover, since the converter accuracy during first (N−1) comparisons can be relaxed, one can choose to slightly speed up the clock also during these ones, relying on the fact that an error on the settling of the comparator input voltage will be corrected by the last two SAR Cycles. This will advantageously compensate the extra time needed for the comparison phase of the last two SAR cycles.

Naturally, in order to satisfy contingent and specific requirements, a person skilled in the art may apply to the above-described analog to digital converter and method many modifications and variations, all of which, however, are included within the scope of protection of the invention as defined by the following claims.

The invention claimed is:

1. A method of Successive Approximation Register (SAR) analog to digital conversion, the method including performance of N+1 SAR cycles to obtain an output digital code having N bits, wherein N is an integer number, the method comprising:
   receiving and sampling an analog signal;
   performing N−1 SAR cycles, each SAR cycle comprising:
      setting a tentative analog signal corresponding to an approximate value of the output digital code; and
      comparing, using a comparator, the sampled analog signal with the tentative analog signal;
   performing the $N^{th}$ SAR cycle by:
      setting a $N^{th}$ tentative analog signal corresponding to a provisional digital code; and
      comparing, using the comparator, the $N^{th}$ tentative analog signal with the sampled analog signal to obtain a $N^{th}$ comparison result, the comparing comprising performance of a plurality of M sub-comparisons between the $N^{th}$ tentative analog signal and the sampled analog signal to obtain M sub-results, the $N^{th}$ comparison result being obtained according to a first decision criterion that takes into account the M sub-results, M being an integer number;
   performing the $(N+1)^{th}$ SAR cycle by:
      setting a $(N+1)^{th}$ tentative analog signal based on the $N^{th}$ comparison result;
      comparing, using the comparator, the $(N+1)^{th}$ tentative analog signal with the sampled analog signal to obtain a second comparison result by: performing a plurality of K sub-comparisons with the comparator between the $(N+1)^{th}$ tentative analog signal and the sampled analog signal, to obtain K sub-results, the $(N+1)^{th}$ comparison result being obtained according to a second decision criterion that takes into account the K sub-results, K being an integer number; and
      correcting the provisional digital code based on the $(N+1)^{th}$ comparison result for obtaining the output digital code.

2. The method of claim 1, wherein M is an odd integer and wherein the first decision criterion is a majority criterion.

3. The method of claim 1, wherein K is an odd integer and wherein the second decision criterion is a majority criterion.

4. The method of claim 1, wherein M =K.

5. The method of claim 1, wherein M=3, wherein K=3, or wherein M=3 and K=3.

6. The method of claim 1, wherein the first decision criteria, the second decision criteria, or both, take into account a predefined weighting of the sub-results.

7. The method of claim 1, wherein setting the $(N+1)^{th}$ tentative analog signal based on the $N^{th}$ comparison result comprises obtaining the $(N+1)^{th}$ tentative analog signal as an analog signal corresponding to a digital code obtained by subtracting one bit from the provisional code, or adding one bit to the provisional digital code.

8. The method of claim 1, wherein correcting the provisional digital code comprises modifying the provisional digital code by an addition or subtraction based on the $(N+1)^{th}$ comparison result.

9. A Successive Approximation Register (SAR) analog to digital converter comprising circuitry configured as:
   a sampling section configured to sample an analog signal to be converted into a digital code of N bits;
   a comparator connected to the sampling section and configured to compare the sampled analog signal with a tentative analog signal, and provide output signals as a function of the difference between the sampled analog signal and the tentative analog signal;

a SAR logic unit coupled at the output of the comparator;

wherein the SAR analog to digital converter is configured to:

perform N−1 SAR cycles, N being an integer number, wherein in each of the N−1 SAR cycles:

the SAR logic unit is configured to set a tentative analog signal corresponding to an approximate value of the output digital code; and the comparator is configured to compare the sampled analog signal with the tentative analog signal;

perform the $N^{th}$ SAR cycle, in which:

the SAR logic unit is configured to set a $N^{th}$ tentative analog signal corresponding to a provisional digital code; and the comparator is configured to compare the $N^{th}$ tentative analog signal with the sampled analog signal in order to obtain a $N^{th}$ comparison result by performing a plurality of M sub-comparisons between the $N^{th}$ tentative analog signal and the sampled analog signal, in order to obtain M sub-results, the $N^{th}$ comparison result being obtained according to a first decision criterion that takes into account the M sub-results, M being an integer number;

perform the $(N+1)^{th}$ SAR cycle in which:

the SAR logic unit is configured to set a $(N+1)^{th}$ tentative analog signal based on the first comparison result; and the comparator is configured to compare the $(N+1)^{th}$ tentative analog signal with the sampled analog signal in order to obtain a $(N+1)^{th}$ comparison result by performing a plurality of K sub-comparisons between the $(N+1)^{th}$ tentative analog signal and the sampled analog signal to obtain K sub-results, the $(N+1)^{th}$ comparison result being obtained according to a second decision criterion that takes into account the K sub-results, K being an integer number;

the SAR logic unit is configured to correct the provisional digital code based on the second comparison result.

10. The SAR analog to digital converter of claim 9, wherein M is an odd integer and wherein the first comparison decision criterion is a majority criterion.

11. The SAR analog to digital converter of claim 9, wherein K is an odd integer and wherein the second comparison decision criterion is a majority criterion.

12. The SAR analog to digital converter of claim 10, wherein the SAR analog to digital converter is included in a mobile terminal.

* * * * *